(12) United States Patent
Ban et al.

(10) Patent No.: US 8,643,028 B2
(45) Date of Patent: Feb. 4, 2014

(54) LIGHTING DEVICE

(75) Inventors: Tae Hyun Ban, Daegu (KR); Kwang Bok Kim, Seoul (KR)

(73) Assignee: Kumho Electric Co., Ltd., Seoul (KR)

( * ) Notice: Subject to any disclaimer, the term of this patent is extended or adjusted under 35 U.S.C. 154(b) by 0 days.

(21) Appl. No.: 13/513,320

(22) PCT Filed: Dec. 21, 2009

(86) PCT No.: PCT/KR2009/007622
§ 371 (c)(1),
(2), (4) Date: Jun. 1, 2012

(87) PCT Pub. No.: WO2011/068278
PCT Pub. Date: Jun. 9, 2011

(65) Prior Publication Data
US 2012/0241731 A1 Sep. 27, 2012

(30) Foreign Application Priority Data
Dec. 2, 2009 (KR) .................. 10-2009-0118142

(51) Int. Cl.
*H01L 27/15* (2006.01)

(52) U.S. Cl.
USPC .............. 257/82; 257/40; 257/98; 257/432; 257/E33.072; 257/E33.076; 257/E33.077

(58) Field of Classification Search
USPC ........ 257/82, 40, 98, 432, E33.072, E33.076, 257/E33.077
See application file for complete search history.

(56) References Cited

U.S. PATENT DOCUMENTS

| 2004/0113543 | A1* | 6/2004 | Daniels ........................ 313/504 |
| 2006/0130894 | A1* | 6/2006 | Gui et al. ...................... 136/263 |
| 2010/0065834 | A1* | 3/2010 | Hammond ....................... 257/40 |
| 2010/0301320 | A1* | 12/2010 | Rand et al. ..................... 257/40 |

FOREIGN PATENT DOCUMENTS

| JP | 2001-351418 A | 12/2001 |
| JP | 2006-066619 A | 3/2006 |
| KR | 20090098648 A | 9/2009 |
| KR | 20100102773 A | 9/2010 |

* cited by examiner

*Primary Examiner* — Tu-Tu Ho
(74) *Attorney, Agent, or Firm* — Rabin & Berdo, P.C.

(57) ABSTRACT

The present invention provides a lighting device, including: a second OLED layer formed on a window; a solar cell formed on the second OLED layer; and a first OLED layer formed on the solar cell.

7 Claims, 2 Drawing Sheets

LIGHTING DEVICE

TECHNICAL FIELD

The present invention relates to a lighting device, and, more particularly, to an OLED lighting device having a solar cell structure, which can realize low-power operation and a functional window made possible by a transparent solar cell and double-sided OLED lighting.

BACKGROUND ART

The development of OLEDs started in 1987. OLEDs may be classified into low-molecular OLEDs and high-molecular OLEDs. A low-molecular OLED was first proposed by engineers of Kodak Ltd. After three years, high-molecular OLEDs were created in 1990 by researchers of Cambridge University. Thereafter, OLDEs have been separately researched and developed by companies using low-molecular materials and companies using high-molecular materials.

An OLED, which is a current drive-type light emitting device, is advantageous compared to an LCD because it can emit light by itself, can be operated at low voltage, and can be fabricated in the form of a thin film. Since an OLED has a wide viewing angle and a rapid response speed, its image quality does not change and it does not leave behind an afterimage, compared to general LCDs. Therefore, OLEDs can be suitably used for moving image displays. Further, OLEDs have high price competitiveness because their image quality is equal to or exceeds that of an LCD when they are applied to a small-size screen, and the manufacturing process thereof is simple.

However, the disadvantages of OLEDs include a short lifespan and the fact that it is not easy to fabricate a large-size display panel using the OLEDs. Currently, efforts to increase the lifespan of an OLED to 30,000~50,000 hours are being made, and research into fabricating a large-size display panel using OLEDs is also being done.

Meanwhile, recently, with the trend to develop environment-friendly energy or green energy, technologies for improving energy efficiency have attracted considerable attention in various fields.

Given such background, it is required to develop new and various kinds of lighting devices using an OLED, which has improved energy efficiency.

DISCLOSURE

Technical Problem

Accordingly, the present invention has been devised to meet the above-mentioned requirements, and an object of the present invention is to provide an OLED lighting device having a solar cell structure.

Another object of the present invention is to provide a lighting device, which can realize low-power operation and a functional window made possible by a transparent solar cell and double-sided OLED lighting.

Still another object of the present invention is to provide a lighting device, in which the color coordinate transformation of an OLED layer is controlled by a control unit, so that the transmissivity or reflectivity of the OLED layer can be controlled, thereby controlling the absorbance of a solar cell.

Technical Solution

In order to accomplish the above objects, a first aspect of the present invention provides a lighting device, including: a second OLED layer formed on a window; a solar cell formed on the second OLED layer; and a first OLED layer formed on the solar cell.

Here, the solar cell may produce electricity from at least one of light emitted from the first OLED layer, light emitted from the second OLED layer, and external light.

Further, the solar cell may include a second solar cell formed on the second OLED layer and a first solar cell formed on the second solar cell, and a glass substrate may be provided between the first and second solar cells.

Further, the glass substrate may be an IZO glass layer or an ITO glass layer.

Further, the lighting device may further include: a first buffer layer for passivating the first OLED layer, the first buffer layer being provided between the first solar cell and the first OLED layer; and a second buffer layer for passivating the second OLED layer, the second buffer layer being provided between the second solar cell and the second OLED layer.

Further, the second OLED layer may be a light source providing color coordinate transformation, and may serve to control the transmissivity of external light or to reflect light emitted from the first OLED layer or other internally generated light.

Further, the electricity produced by the solar cell may be supplied to the first OLED layer or the second OLED layer.

Further, the electricity produced by the solar cell may be supplied to a battery.

A second aspect of the present invention provides a lighting device, including: a solar cell formed on a window; and an OLED layer formed on the solar cell.

Here, the solar cell may produce electricity from at least one of light emitted from the OLED layer and external light.

Further, the lighting device may further include: a buffer layer for passivating the OLED layer, the buffer layer being provided between the solar cell and the OLED layer.

Further, a reflecting plate may be provided between the window and the solar cell, or a reflective material may be applied on a surface of the solar cell which faces the window.

Further, the electricity produced by the solar cell may be supplied to the OLED layer.

Further, the electricity produced by the solar cell may be stored in a battery.

Advantageous Effects

The present invention provides an OLED lighting device having a solar cell structure. The OLED lighting device can realize low-power operation and a functional window made possible by a transparent solar cell and double-sided OLED lighting.

In the lighting device according to the first embodiment of the present invention, first, when external illumination (external light) turns OFF and internal illumination (that is, first OLED layer) turns ON, the second OLED layer induces the light emitted from the first OLED layer to be reflected by the color coordinate transformation of the second OLED layer, thus allowing the first solar cell or the second solar cell to reabsorb the reflected light, thereby maximizing energy efficiency.

Next, when external illumination (external light) turns OFF and internal illumination (that is, first OLED layer 400) turns OFF, external light is blocked by the color coordinate transformation of the second OLED layer 450, thus allowing the second OLED layer 450 to serve as a functional window.

Next, when external illumination (external light) turns ON, the second OLED layer can be made transparent or translucent by the color coordinate transformation thereof such that the maximum quantity of light can be absorbed in the first solar cell 200 or the second solar cell 250 or the absorbance of the first solar cell 200 or the second solar cell 250 can be controlled by a control unit (not shown).

Consequently, owing to the color coordination transformation of the second OLED layer by the control unit, persons located outside a window perceive that the color of the window has changed.

Meanwhile, the lighting device according to the second embodiment of the present invention is advantageous in that the solar cell absorbs external light or internal light by a simple structure, thus increasing energy efficiency, and in that the absorbance of the solar cell can be improved when a reflecting plate (not shown) is provided between the window and the solar cell or when a reflective material is applied on a surface of the solar cell which faces the window.

BEST MODE

Hereinafter, preferred embodiments of the present invention will be described in detail with reference to the accompanying drawings. Prior to this, the terms and words used in the present specification and claims should not be interpreted as being limited to typical meanings or dictionary definitions, but should be interpreted as having meanings and concepts pertinent to the technical scope of the present invention based on the rule according to which an inventor can appropriately define the concept of the term to describe the best method he or she knows for carrying out the invention.

Therefore, it should also be understood that the foregoing relates to only the scope of the invention which is defined by the appended claims rather than by the description preceding them, and all changes that fall within the meets and bounds of the claims, or the equivalence of such meets and bounds, are therefore intended to be embraced by the claims.

(First Embodiment)

Figure 1:
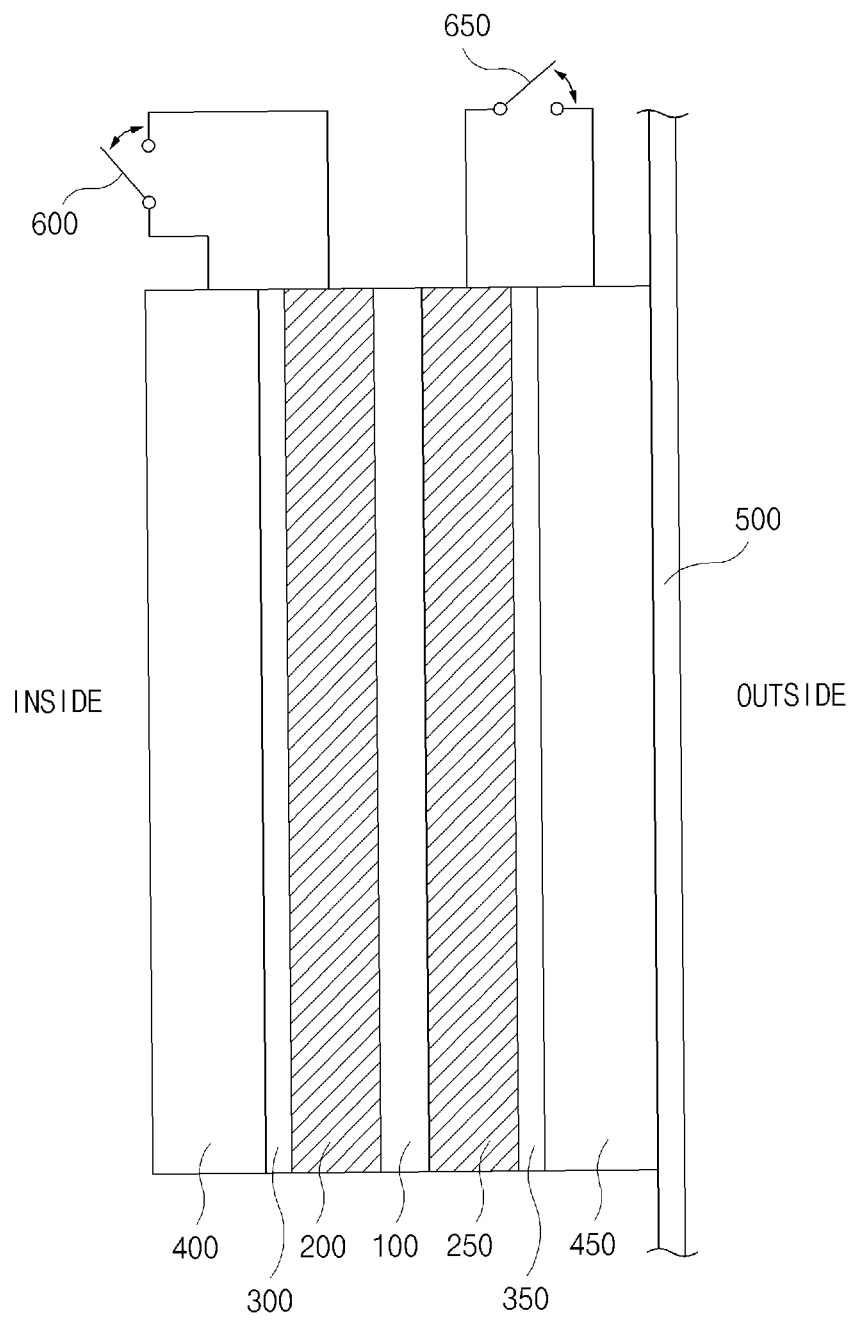
FIG. 1 is a sectional view showing a lighting device according to a first embodiment of the present invention.

FIG. 1 is a sectional view showing a lighting device according to a first embodiment of the present invention. Hereinafter, the lighting device according to the first embodiment of the present invention will be described with reference to FIG. 1.

As shown in FIG. 1, the lighting device according to the first embodiment of the present invention includes: a second OLED layer 450 formed on a window 500; solar cells 200 and 250 formed on the second OLED layer 450; and a first OLED layer 400 formed on the solar cell 200.

Here, the lighting device can be applied to: household lighting devices used in living rooms, kitchens, bedrooms, bathrooms and the like; commercial lighting devices used in commercial facilities such as offices, factories, restaurants and the like; and lighting devices for airplanes, automobiles, vehicles and the like. The lighting device can be used anywhere as long as it has a glass window 500 which transmits external light into the lighting device.

The first OLED layer 400 or the second OLED layer 450 may include a substrate, an anode layer, an organic layer and a cathode layer, and the organic layer is generally is formed in the form of a thin film. Here, when a high-molecular organic material is used, the organic layer may have a two-layer structure of an emitting material layer and a hole injection layer. In contrast, when a low-molecular organic material is used, the organic layer may have a multi-layer structure of a hole injection layer, a hole transport layer, an emitting material layer, a hole blocking layer, an electron transport layer and the like.

Generally, the substrate is made of glass, and is provided thereon with a grid. The grid is in contact with the anode layer, and serves to decrease the electrical resistance of the anode layer when the anode layer is connected to the wiring of a drive unit for providing illumination. The grid may be made of a metal having lower resistance than the anode layer, such as chromium (Cr), copper (Cu), molybdenum (Mo), nickel (Ni), aluminum (Al), silver (Ag) or gold (Au). The grid may be formed by depositing a metal on the substrate or by applying, developing or etching a photoresist. If necessary, the substrate may not be provided with a grid when it must be transparent.

The anode layer serves as an anode, which corresponds to a positive electrode of the OLED layer. The anode layer may be made of a transparent conductive material having low surface resistance and good transmissivity, such as indium tin oxide (ITO), indium zinc oxide (IZO) or the like. When the anode layer is formed on the grid, the resistance of the anode layer becomes lower, and simultaneously the power consumption and drive voltage at the time of driving the OLED lighting device by connecting the anode layer with an external drive circuit become low, thus improving the electrical characteristics thereof.

The organic layer is formed on the anode layer, and emits light. In order to increase luminescent efficiency, the organic layer is formed by sequentially depositing a hole injection layer (HIL), a hole transport layer (HTL), an emitting material layer (EML), an electron transport layer (ETL) and an electron injection layer (EIL). The organic layer may be made of an organic material, such as Alq3, TPD, PBD, m-MTDATA, TCTA or the like.

Further, the cathode layer is deposited on the organic layer. The cathode layer may be made of any one selected from aluminum, copper, silver, lithium fluoride (LiF) and alloys thereof.

Meanwhile, the first OLED layer 400 or the second OLED layer 450 may have a double-sided emission structure.

A bottom emission structure used in a conventional OLED device is problematic in that light is emitted from a TFT substrate using a transparent anode, and TFT and wiring are not transparent, so that only the TFT substrate excluding the TFT and wiring emits light, thereby narrowing the region that emits light. In order to solve the above problem, a top emission structure was proposed. In the top emission structure, light is emitted toward the upper side of the OLED device, the upper side thereof being not provided with TFT, using a transparent cathode. Therefore, the top emission structure is advantageous in that, since light is emitted without using the TFT substrate, light can be emitted regardless of the arrangement of TFT or wiring, and the region that emits light can be wider. In particular, the top emission structure can be advantageously used in large-size displays requiring high brightness.

However, in the present invention, the use of a double-sided emission structure, which can be realized using a transparent anode or cathode, is suitable.

Here, the solar cells 200 and 250 produce electricity using at least one of light emitted from the first OLED layer 400, light emitted from the second OLED layer 450, and external light. Here, the external light includes light directly externally-supplied into the solar cells 200 and 250 and light indirectly externally-supplied into solar cells 200 and 250 after being reflected from the inner side thereof.

The electricity produced by the solar cells 200 and 250 can be supplied to the first OLED layer 400 or the second OLED layer 450, and can be stored in a battery (not shown). The electricity stored in the battery can be supplied to the first OLED layer 400 or the second OLED layer 450, and the supply of electricity to the first OLED layer 400 or the second OLED layer 450 can be controlled by a switch 600 and a switch 650. Here, as shown in FIG. 1, the switch 600 can control to supply the electricity produced by the first solar cell 200 to the first OLED layer 400 or to store the electricity in the battery, and the switch 650 can control to supply the electricity produced by the second solar cell 250 to the second OLED layer 450 or to store the electricity in the battery. If necessary, the electricity produced by the first solar cell 200 and the second solar cell 250 may be integrally switched and controlled.

The solar cells includes a second solar cell 250 formed on the second OLED layer 450 and a first solar cell 200 formed on the second solar cell 250. In this case, it is preferable that a glass substrate 100 be disposed between the first solar cell 200 and the second solar cell 250.

Meanwhile, the solar cell used in the present invention may be a dye-sensitized solar cell, which was developed to have high energy efficiency using an organic dye and a nanotechnology. Such a dye-sensitized solar cell, which is a cell producing electricity using a dye, was developed to have high energy efficiency using a cheap organic dye and nanotechnology, and is advantageous in that the production cost thereof can be reduced by ⅓ to ⅕ compared to that of a conventional silicon solar cell. In particular, when this dye-sensitized solar cell is used in a glass window, transparent and various colors can be realized. Further, since this dye-sensitized solar cell can transmit visible light, it can be directly attached to the glass windows of buildings or automobiles.

Here, the glass substrate 100 is an IZO glass layer or an ITO glass layer. Owing to the glass substrate 100, systems disposed inside and outside thereof can be each independently driven.

Further, a first buffer layer 300 for passivating the first OLED layer 400 may be provided between the first solar cell 200 and the first OLED layer 400, and a second buffer layer 350 for passivating the second OLED layer 450 may be provided between the second solar cell 250 and the second OLED layer 450.

In the present invention, since the OLED layer cannot be encapsulated with a metal or glass in order to efficiently the dye layer of the solar cell and the organic layer of the OLED layer, it is preferred that the first buffer layer 300 for passivating the first OLED layer 400 and the second buffer layer 350 for passivating the second OLED layer 450 be additionally provided. Owing to these buffer layers 300 and 350, the organic layer of the first OLED layer 400 or the second OLED layer 450 can be protected from moisture or oxygen.

Further, the second OLED layer 450, which is a light source for providing color coordinate transformation, serves to control the transmissivity of external light or to reflect light emitted from the first OLED layer 400 or other internal light. The color of the second OLED layer 450 is transformed into black, gray or the like by a control unit (not shown), and the transmissivity thereof is controlled by the control unit.

Hereinafter, the operation of the lighting device according to the first embodiment of the present invention will be described.

First, when external illumination (external light) turns OFF and the internal illumination (that is, first OLED layer 400) turns ON, the second OLED layer 450 induces the light emitted from the first OLED layer 400 to be reflected by the color coordinate transformation of the second OLED layer 450, thus allowing the first solar cell 200 or the second solar cell 250 to reabsorb the reflected light.

Next, when external illumination (external light) turns OFF and the internal illumination (that is, first OLED layer 400) turns OFF, external light is blocked by the color coordinate transformation of the second OLED layer 450.

Next, when external illumination (external light) turns ON, the second OLED layer can be made transparent or translucent by the color coordinate transformation thereof such that the maximum quantity of light can be absorbed by the first solar cell 200 or the second solar cell 250 or the absorbance of the first solar cell 200 or the second solar cell 250 can be controlled by a control unit (not shown).

As such, owing to the color coordination transformation of the second OLED layer by the control unit, persons located outside a window perceive that the color of the window has changed.

(Second Embodiment)

Figure 2:
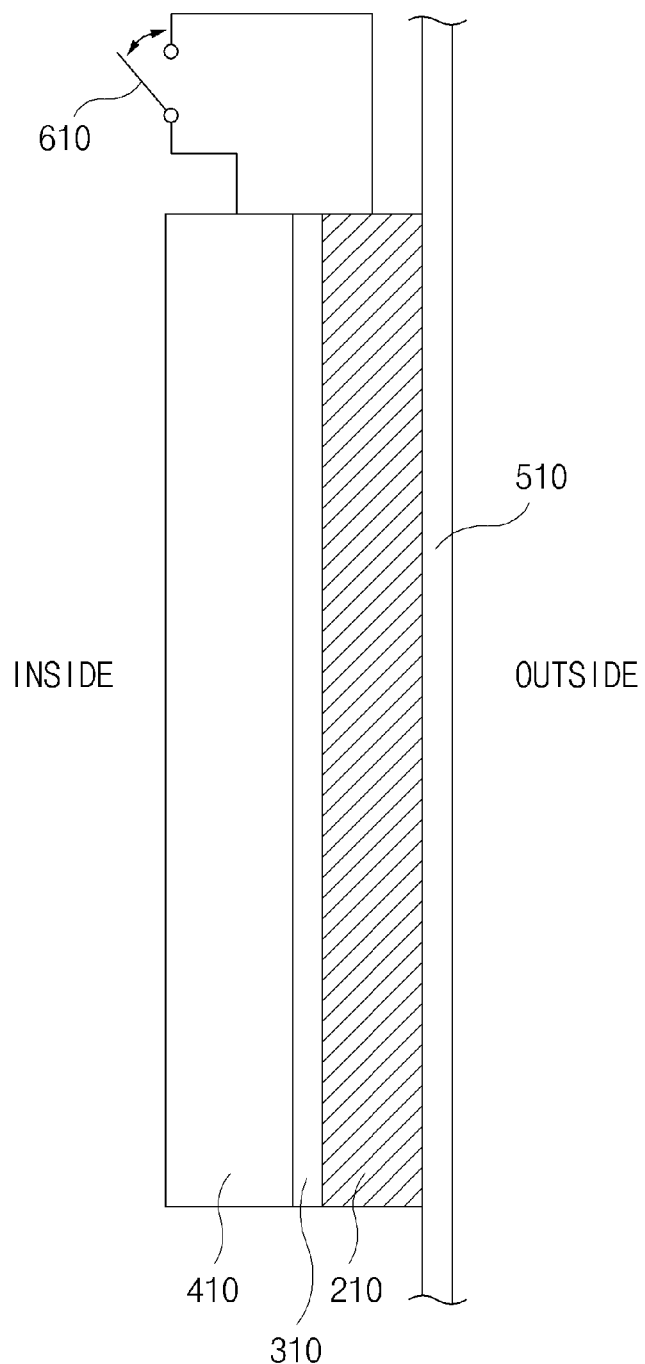
FIG. 2 is a sectional view showing a lighting device according to a second embodiment of the present invention.

FIG. 2 is a sectional view showing a lighting device according to a second embodiment of the present invention. Hereinafter, the lighting device according to the second embodiment of the present invention will be described with reference to FIG. 2. Here, a description that would overlap with the above description of the lighting device according to the first embodiment will be omitted.

As shown in FIG. 2, the lighting device according to the second embodiment of the present invention includes: a solar cell 210 formed on a window 510; and an OLED layer 410 formed on the solar cell 210.

The OLED layer 410 may include a substrate, an anode layer, an organic layer and a cathode layer, and the organic layer is generally formed in the form of a thin film. The OLED layer 410 may have a double-side emission structure, which can be realized using a transparent anode and cathode.

Here, the solar cell 210 produces electricity using at least one of light emitted from the OLED layer 410 and external light. Here, the external light includes light directly externally-supplied into the solar cell 210 and light indirectly externally-supplied into solar cells 210 after being reflected from the inner side thereof.

The electricity produced by the solar cell 210 can be supplied to the OLED layer 410 and can be stored in a battery (not shown). The electricity stored in the battery can be supplied to the OLED layer 410, and the supply of electricity to the OLED layer 410 can be controlled by a switch 610.

Meanwhile, the solar cell used in the present invention may be a dye-sensitized solar cell, which was developed to have high energy efficiency using an organic dye and a nanotechnology.

Further, a buffer layer 310 for passivating the OLED layer 410 may be provided between the solar cell 210 and the OLED layer 410.

In the present invention, since the OLED layer cannot be encapsulated with metal or glass in order to efficiently the dye layer of the solar cell and the organic layer of the OLED layer, it is preferred that the buffer layer 310 for passivating the OLED layer 410 be additionally provided. Owing to the buffer layer 310, the organic layer of the OLED layer 410 can be protected from moisture and oxygen.

Further, it is preferred in terms of improving the absorbance of the solar cell 210 that a reflecting plate (not shown) be provided between the window 510 and the solar cell 210 or a reflective material be applied on the lateral side of the solar cell 210 facing the window 510.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A lighting device, comprising:
   a second OLED layer formed on a window;
   a solar cell formed on the second OLED layer; and
   a first OLED layer formed on the solar cell;
   wherein the solar cell comprises a second solar cell formed on the second OLED layer and a first solar cell formed on the second solar cell, and a glass substrate is provided between the first solar cell and the second solar cell.

2. The lighting device of claim 1, wherein the solar cell produces electricity from at least one of light emitted from the first OLED layer, light emitted from the second OLED layer, and external light.

3. The lighting device of claim 1, wherein the glass substrate is an IZO glass layer or an ITO glass layer.

4. The lighting device of claim 1, further comprising:
   a first buffer layer for passivating the first OLED layer, the first buffer layer being provided between the first solar cell and the first OLED layer; and
   a second buffer layer for passivating the second OLED layer, the second buffer layer being provided between the second solar cell and the second OLED layer.

5. The lighting device of claim 1, wherein the second OLED layer is a light source for providing color coordinate transformation, and serves to control the transmissivity of external light or to reflect light emitted from the first OLED layer or other internally generated light.

6. The lighting device of claim 2, wherein the electricity produced by the solar cell is supplied to the first OLED layer or the second OLED layer.

7. The lighting device of claim 2, wherein the electricity produced by the solar cell is supplied to a battery.

\* \* \* \* \*